US011289794B2

(12) United States Patent
Lin et al.

(10) Patent No.: US 11,289,794 B2
(45) Date of Patent: Mar. 29, 2022

(54) ELECTRONIC PACKAGE

(71) Applicant: SILICONWARE PRECISION INDUSTRIES CO., LTD., Taichung (TW)

(72) Inventors: Rung-Jeng Lin, Taichung (TW); Han-Hung Chen, Taichung (TW); Shi-Min Zhou, Taichung (TW); Kuo-Hua Yu, Taichung (TW); Chang-Fu Lin, Taichung (TW)

(73) Assignee: SILICONWARE PRECISION INDUSTRIES CO., LTD, Taichung (TW)

( * ) Notice: Subject to any disclaimer, the term of this patent is extended or adjusted under 35 U.S.C. 154(b) by 0 days.

(21) Appl. No.: 16/859,009

(22) Filed: Apr. 27, 2020

(65) Prior Publication Data

US 2021/0203057 A1     Jul. 1, 2021

(30) Foreign Application Priority Data

Dec. 31, 2019  (TW) ............................... 108148637

(51) Int. Cl.
| | | |
|---|---|---|
| *H05K 7/00* | (2006.01) | |
| *H01Q 1/22* | (2006.01) | |
| *H01L 23/498* | (2006.01) | |
| *H01L 23/00* | (2006.01) | |
| *H01L 23/66* | (2006.01) | |

(52) U.S. Cl.
CPC ..... *H01Q 1/2283* (2013.01); *H01L 23/49816* (2013.01); *H01L 23/564* (2013.01); *H01L 23/66* (2013.01); *H01L 2223/6677* (2013.01)

(58) Field of Classification Search
CPC ................ H01Q 1/2283; H01L 23/564; H01L 23/49816; H01L 23/66; H01L 2223/6677
USPC ......................................................... 361/782
See application file for complete search history.

(56) References Cited

U.S. PATENT DOCUMENTS

| | | | | |
|---|---|---|---|---|
| 7,992,482 B2 * | 8/2011 | Kim | ...................... | C03B 33/03 83/879 |
| 9,691,636 B2 * | 6/2017 | Wu | ................... | H01L 23/49827 |
| 2012/0290760 A1 * | 11/2012 | McCormack | ........... | H01Q 5/25 710/303 |
| 2013/0187266 A1 * | 7/2013 | Chen | ...................... | H01L 24/81 257/737 |
| 2014/0070411 A1 * | 3/2014 | Okada | ............... | H01L 23/49811 257/737 |
| 2014/0367854 A1 * | 12/2014 | Zhao | .................. | H01L 23/49833 257/738 |
| 2015/0263421 A1 * | 9/2015 | Chiu | ..................... | H01L 23/552 343/702 |
| 2015/0325516 A1 * | 11/2015 | Lin | ......................... | H01L 25/50 257/774 |
| 2015/0340765 A1 * | 11/2015 | Dang | ................. | H01Q 21/0075 343/893 |

(Continued)

*Primary Examiner* — Andargie M Aychillhum
(74) *Attorney, Agent, or Firm* — Kelly & Kelley, LLP

(57) ABSTRACT

An electronic package is disclosed. An antenna board is stacked on a circuit board. A frame is formed on the circuit board. A supporter disposed between the antenna board and the circuit board is secured in the frame. In a packaging process, the frame ensures that the antenna board and the circuit board are separated at a distance that complies with a requirement, and that the antenna function of the antenna board can function normally.

8 Claims, 5 Drawing Sheets

(56) References Cited

U.S. PATENT DOCUMENTS

| | | | |
|---|---|---|---|
| 2016/0049723 A1* | 2/2016 | Baks | H01Q 1/2291 |
| | | | 343/848 |
| 2016/0056544 A1* | 2/2016 | Garcia | H01Q 1/38 |
| | | | 343/725 |
| 2018/0138155 A1* | 5/2018 | Kim | H01L 23/552 |

* cited by examiner

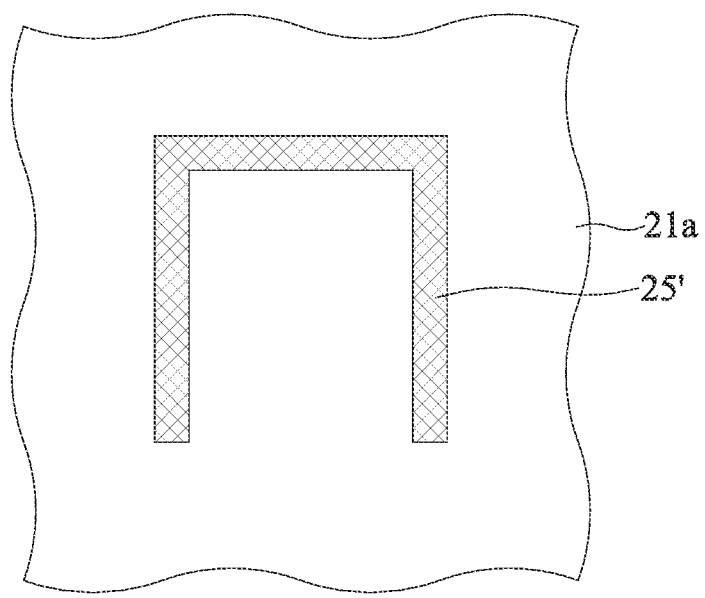
FIG. 3A'
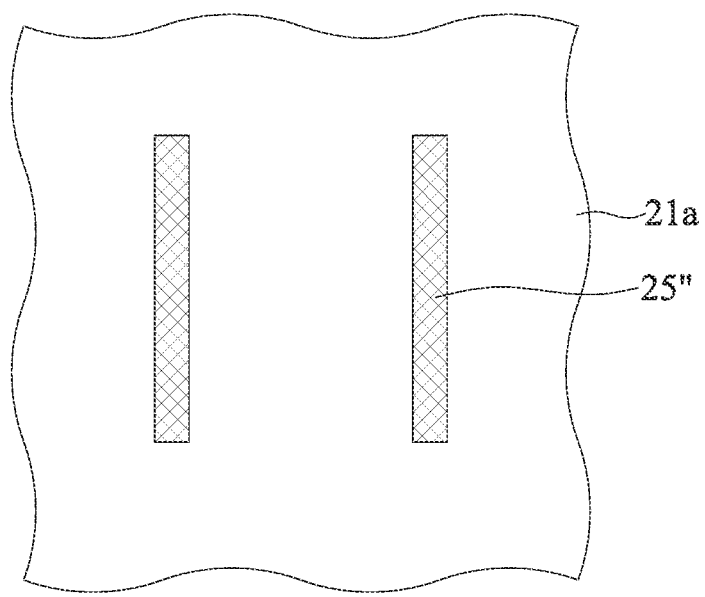
FIG. 3A"

ELECTRONIC PACKAGE

CROSS-REFERENCE TO RELATED APPLICATIONS

This application claims priority to Taiwanese Application Serial No. 108148637, filed on Dec. 31, 2019. The entirety of the application is hereby incorporated by reference herein and made a part of this specification.

BACKGROUND

1. Technical Field

The present disclosure relates to electronic packages, and, more particularly, to an electronic package having an antenna structure.

2. Description of the Prior Art

Modern wireless communication techniques are applied to a variety of consumer electronic products for receiving and transmitting various types of wireless signals. In order for the consumer electronic products to meet the appearance design requirements, wireless communication modules are developed to be compact and low-profiled. A patch antenna, since being small, light and easy to be fabricated, has been widely applied to wireless communication modules in an electronic product, such as a cell phone.

FIG. 1 is a cross-sectional view of a wireless communication module 1 according to the prior art. The wireless communication module 1 has a circuit board 10, a semiconductor chip 11 disposed on a lower side of the circuit board 10, and a substrate 12 having an antenna (not shown) and stacked on an upper side of the circuit board 10 via a plurality of solder bumps 18. The circuit board 10 has a ground piece (not shown) and antenna feed lines (not shown). A plurality of solder balls 19 are formed under the circuit board 10. A spare region A (which is surrounded by the solder bumps 18 and in which no spot gluing or molding filler exists) is defined between the circuit board 10 and the substrate 12. A distance L between the circuit board 10 and the substrate 12 needs to be controlled to ensure the quality of signals transmitted between the antenna and the semiconductor chip 11.

However, in the wireless communication module 1 according to the prior art, after the substrate 12 is stacked on the circuit board 10, such a stacking structure will be flipped over, for the solder balls 19 to be melted and reflowed. The melted solder balls change the distance L between the circuit board 10 and the substrate 12, and affect the function of the antenna. As a result, the yield of the product is reduced.

Therefore, how to solve the problems of the prior art is becoming an urgent issue in the art.

SUMMARY

In view of the problems of the prior art, the present disclosure provides an electronic package, comprising: a first substrate having a first surface, a second surface opposing the first surface, and a circuit layer; a frame formed on the first surface of the first substrate; and a second substrate having an antenna structure and stacked on the first surface of the first substrate via a supporter that is disposed in the frame correspondingly.

In an embodiment, a region enclosed between the first substrate and the second substrate is defined with a spare region and a support region outward from a center sequentially, and the frame is located in the support region.

In an embodiment, a bonding material is formed in the frame and secured to the supporter. In another embodiment, the bonding material is a thermosetting material.

In an embodiment, the frame is in no contact with the second substrate.

In an embodiment, the frame is made of an insulation material.

In an embodiment, the supporter is not electrically connected to the first substrate.

In an embodiment, a bonding material separates the supporter from the first substrate.

In an embodiment, an electronic component is disposed on the first substrate.

In an embodiment, a conductive element is disposed on the second surface of the first substrate.

It is known from the above that in the electronic package according to the present disclosure, the frame encloses the supporter to allow the first substrate to be stacked on the second substrate stably with a distance between the first substrate and the second substrate to comply with a requirement. Therefore, in a packaging process (e.g., a reflow process), even if the first substrate and the second substrate change their locations, the frame with a constant height limits the displacement of the second substrate, so as to ensure that a distance between the first substrate and the second substrate complies with a requirement. Compared with the prior art, the electronic package according to the present disclosure does not affect the function of the antenna structure when the distance between the first substrate and the second substrate is changed, thereby avoiding the problem of a decrease in product yield.

BRIEF DESCRIPTION OF THE DRAWINGS

FIGS. 3A' and 3A" are top views of a locally enlarged portion of the frame shown in FIG. 3A.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

FIGS. 2A to 2D are cross-sectional views illustrating a method for fabricating an electronic package 2 according to the present disclosure.

Figure 1:
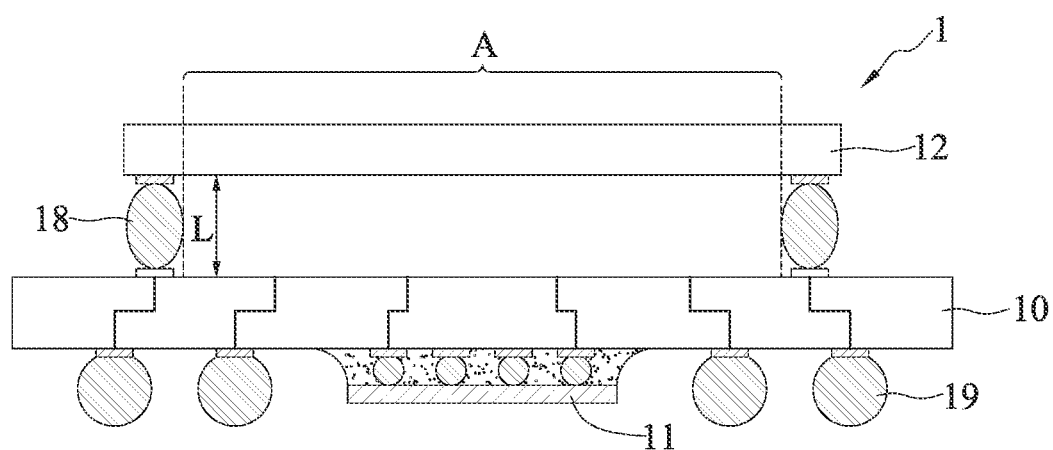
FIG. 1 is a cross-sectional view of a wireless communication module according to prior art.
Figure 2A:
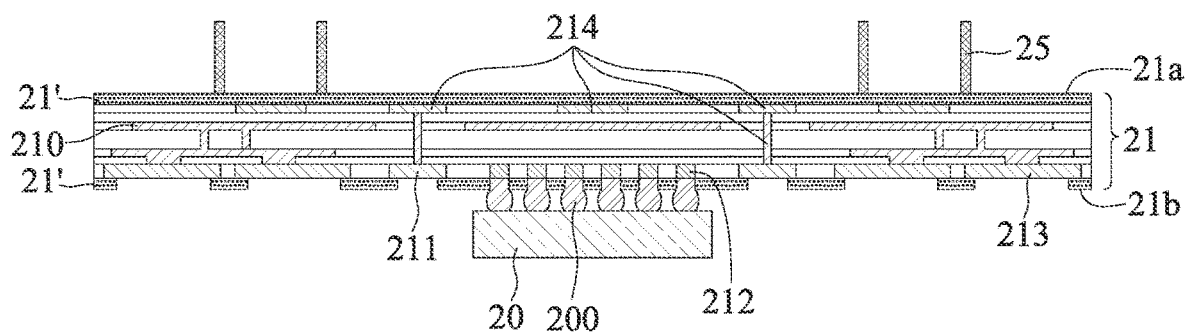
FIGS. 2A to 2D are cross-sectional views illustrating a method for fabricating an electronic package according to the present disclosure.

As shown in FIG. 2A, a first substrate 21 having a circuit layer is provided. In an embodiment, the first substrate 21 has a first surface 21a and a second surface 21b opposing the first surface 21a, and at least one or a plurality of frames 25 are formed on the first surface 21a of the first substrate 21.

In an embodiment, the first substrate 21 is a circuit board, and an insulation protection layer 21', such as a solder mask, is formed on the outermost surface thereof. In an embodiment, the first substrate 21 has an antenna 214, a ground piece 210, and a circuit layer 211 electrically connected to the ground piece 210. In an embodiment, the antenna 214 is a circuit antenna and electrically insulated from the circuit layer 211 (or from the ground piece 210). In an embodiment, the circuit layer 211 includes a plurality of conductive contacts 212 and a plurality of ball-planting pads 213. In another embodiment, the first substrate 21 is a carrier that carries a chip.

Figure 3A:
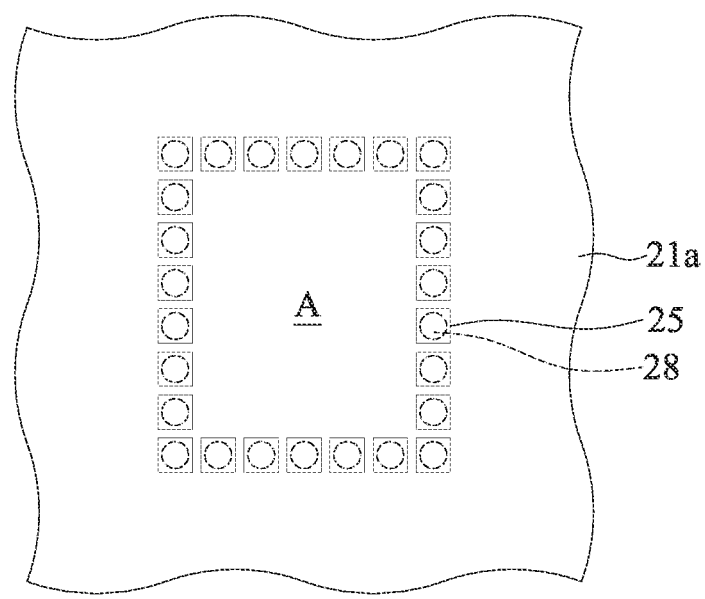
FIG. 3A is a top view of the first substrate shown in FIG. 2C.

In an embodiment, the frame 25 is an insulator, such as a solder mask. In another embodiment, the frame 25 and the insulation protection layer 21' are made of the same material. In yet another embodiment, the frame 25 is integrated with the insulation protection layer 21'. In still another embodiment, the plurality of frames 25 surround the edge of the first surface 21a of the first substrate 21, as shown in FIG. 3A.

Figure 3B:
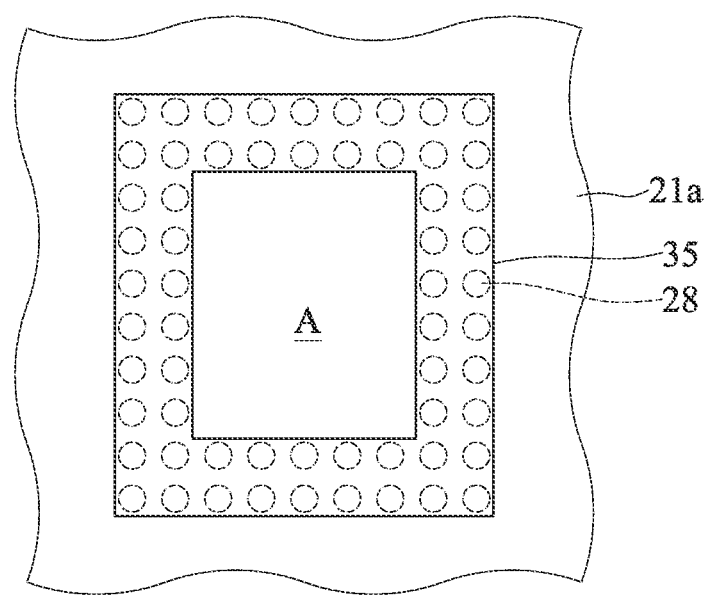
FIG. 3B schematically illustrates another embodiment of FIG. 3A.

In an embodiment, the frame 25 is a block dam structure, for bumps to be received therein. Refer to FIGS. 3A, 3A' and 3A". The frame 25, 25', 25" is in the shape of a ring (shown in FIG. 3A), an open rectangle (shown in FIG. 3A'), or a bar (shown in FIG. 3A"). As shown in FIG. 3B, a single frame 35 is disposed on the first surface 21a of the first substrate 21. In an embodiment, the frame 35 is in the shape of a groove. In another embodiment, the shape of the frame 35 is not limited.

In an embodiment, at least one electronic component 20 is disposed on the second surface 21b of the first substrate 21. In another embodiment, the electronic component 20 is an active element, such as a semiconductor chip, a passive element, such as a resistor, a capacitor or an inductor, or a combination thereof. In yet another embodiment, the electronic component 20 is electrically connected in a flip-chip manner to the conductive contacts 212 via a plurality of conductive bumps 200 made of a solder material. In still another embodiment, the electronic component 20 is electrically connected in a wire bonding manner to the circuit layer 211 via a plurality of solder wires (not shown). In further another embodiment, the electronic component 20 is in direct contact with the conductive contacts 212 and electrically connected to the circuit layer 211. In an embodiment, the electronic component 20 is electrically connected to the first substrate 21 in other manners. In another embodiment, the electronic component 20 is disposed on the first surface 21a of the first substrate 21.

Figure 2B:
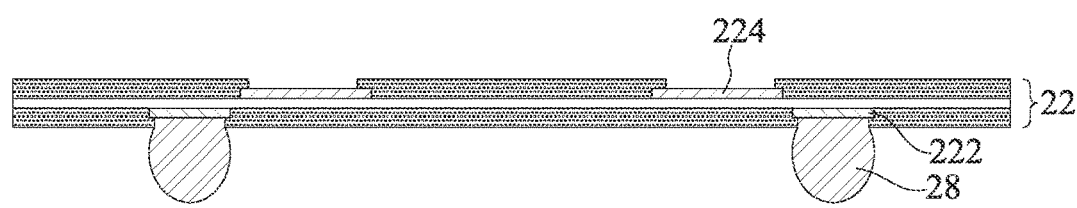
Figure 2B:
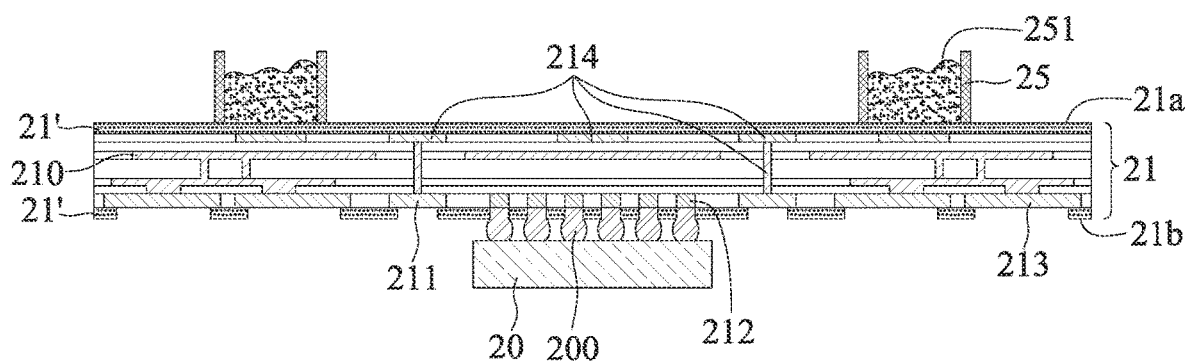

As shown in FIG. 2B, a second substrate 22 having an antenna structure 224 is provided, and a bonding material 251 is formed in the frame 25.

In an embodiment, the second substrate 22 is an antenna board and has an antenna structure 224 and a plurality of external pads 222. In another embodiment, the antenna structure 224 is a circuit antenna electrically insulated from the external pads 222. In yet another embodiment, a supporter 28 is disposed on the external pads 222. In still another embodiment, the supporter 28 is made of a solder material, a metal pillar or other metal structures. In further another embodiment, the second substrate 22 is an antenna board of another type.

In an embodiment, the bonding material 251 is a thermosetting material. In another embodiment, the bonding material 251 is formed by filling thermosetting material into the frame 25 with a glue needle.

Figure 2C:
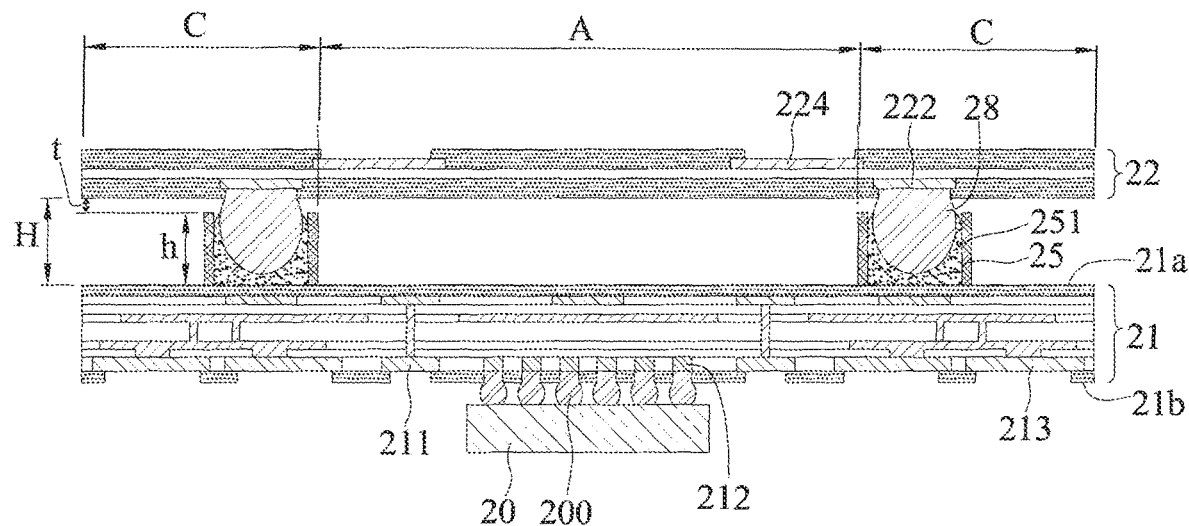

As shown in FIG. 2C, the second substrate 22 is stacked on the first surface 21a of the first substrate 21 via the supporters 28, each of the supporters 28 is located in corresponding one of the frames 25. In an embodiment, the plurality of the supporters 28 are disposed in a single frame 35, as shown in FIG. 3B.

In an embodiment, the supporter 28 is inserted into the frame 25 and embedded in the bonding material 251. After the supporter 28 is inserted into the frame 25, the bonding material 251 is heated to cure the thermosetting material to secure the supporter 28. In embodiment, the supporter 28 is not in contact with and electrically connected to the first substrate 21. In another embodiment, the supporter 28 is in contact with the insulation protection layer 21' of the first substrate 21.

The antenna structure 224 senses the antenna 214, and signals are transmitted between the antenna structure 224 and the antenna 214.

A region enclosed between the first substrate 21 and the second substrate 22 is defined with a spare region A and a support region C outward from a center sequentially. In an embodiment, no spot gluing or molding filler exists in the spare region A, to ensure the quality of signals transmitted and received by the antenna structure 224. In another embodiment, the supporters 28 (or the frames 25) are disposed within the support region C.

Figure 2D:
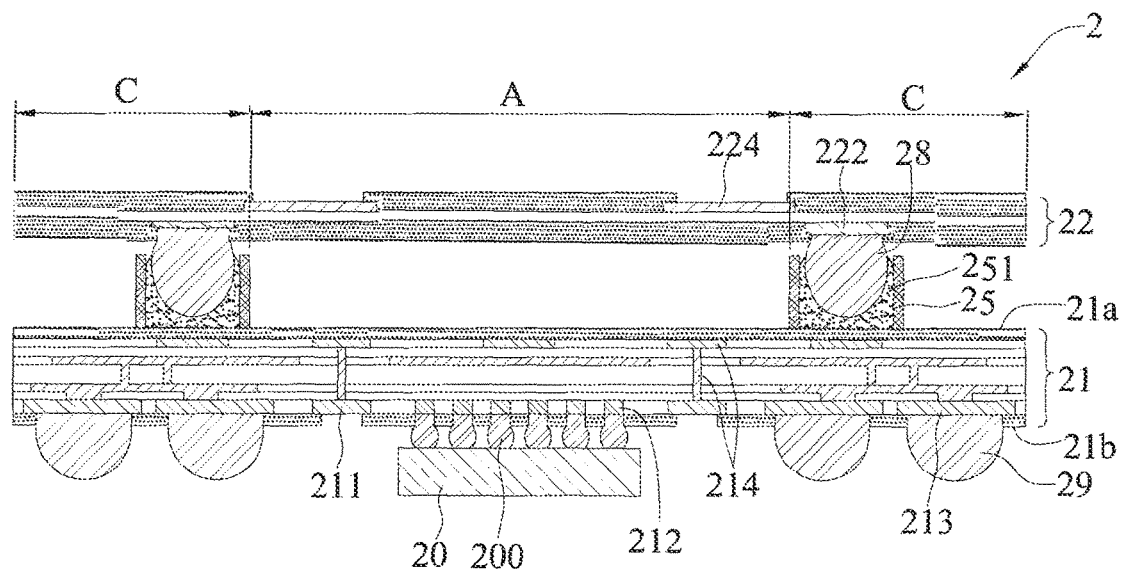

As shown in FIG. 2D, a plurality of conductive elements 29, such as solder balls, are formed and reflowed on the ball-planting pads 213, for an electronic structure, such as the circuit board or another circuit board to be mounted thereon, such that the electronic package 2 is obtained.

In the method for fabricating the electronic package, the frame 25, 25', 25", 35 encloses the supporter 28, to ensure that the distance H, about 270±45 µm, between the first substrate 21 and the second substrate 22 complies with the requirement. When the supporters 28 or the conductive elements 29 are reflowed and baked, the melted supporter 28 or other factors will not change the relative location of the first substrate 21 with the second substrate 22 (a height difference t between the distance H and the height h of the frame 25, 25', 25", 35), since the height h of the frame 25, 25', 25", 35 is constant and keeps the second substrate 22 to stay substantially at its original location, and the height difference t is controlled (up to 90 µm). Therefore, the distance between the first substrate 21 and the second substrate 22 complies with the requirement.

If the supporter 28 is embedded in the bonding material 251, when the conductive elements 29 are reflowed and baked, the second substrate 22 does not sag due to the gravity (the bonding material 251 has bonded to the supporter 28), so the distance H between the first substrate 21 and the second substrate 22 does not change.

Compared with the prior art, the electronic package 2 according to the present disclosure will not affect the function of the antenna structure 224 and the antenna 214 when the distance H between the first substrate 21 and the second substrate 22 is changed, and thus can effectively control the quality of the antenna, thereby improving the yield of the product.

Metal pads that are used to bond the supporters 28 are not required to be disposed on the first surface 21a of the first substrate 21. Therefore, the fabrication process is simplified and reduced, the cost is reduced, and the layout space of the first substrate 21 is increased.

A receiving space for the supporters 28 to be bonded thereto is also not required to be formed in the second substrate 22. Therefore, the fabrication process is simplified and reduced, the cost is reduced, and the antenna structure 224 can be prevented from being damaged (e.g., the antenna structure 224 being damaged by a concentrated stress). In an embodiment, the frame 25, 25', 25", 35 is in no contact with the second substrate 22. Therefore, the frame 25, 25', 25", 35, even if being warpage during a heating process, will not press the second substrate 22 and damage the antenna structure 224.

The frame 25, 25', 25", 35 can limit the layout range of the bonding material 251. The frame 35, which is in the shape of a groove, can further prevent the bonding material 251 from overflowing. Therefore, the selection of the bonding material 251 will not be limited by the glue viscosity.

The present disclosure further provides an electronic package 2, which comprises: a first substrate 21 having a circuit layer 211, a second substrate 22 having an antenna structure 224, and at least one frame 25, 25', 25", 35.

The first substrate 21 has a first surface 21a and a second surface 21b opposing the first surface 21a.

The frame 25, 25', 25", 35 is formed on the first surface 21a of the first substrate 21.

The second substrate 22 is stacked on the first surface 21a of the first substrate 21 via at least one supporter 28, which is disposed in the frame 25, 25', 25", 35 correspondingly.

In an embodiment, a region enclosed between the first substrate 21 and second substrate 22 is defined with a spare region A and a support region C outward from a center sequentially, and the frame 25 is located within the support region C.

In an embodiment, a bonding material 251 is formed in the frame 25, 25', 25", 35 to secure the supporter 28. In another embodiment, the bonding material 251 is a thermosetting material.

In an embodiment, the frame 25, 25', 25", 35 is in no contact with the second substrate 22.

In an embodiment, the frame 25, 25', 25", 35 is made of an insulation material.

In an embodiment, the supporter 28 is not electrically connected to the first substrate 21.

In an embodiment, a bonding material 251 separates the supporter 28 from the first substrate 21.

In an embodiment, the electronic package 2 further comprises at least one electronic component 20 disposed on the first substrate 21.

In an embodiment, the electronic package 2 further comprises a plurality of conductive elements 29 disposed on the second surface 21b of the first substrate 21.

In the electronic package according to the present disclosure, the frame ensures that the distance between the first substrate and the second substrate still complies with the requirement after a heating process. Therefore, the electronic package according to the present disclosure ensures that the antenna structure functions normally, and has an expected yield.

The foregoing descriptions of the detailed embodiments are illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. An electronic package, comprising: a first substrate having a first surface, a second surface opposing the first surface, and a circuit layer; a frame formed on the first surface of the first substrate; a bonding material formed in the frame; and a second substrate having an antenna structure and stacked on the first surface of the first substrate via a supporter disposed in the frame correspondingly, wherein the supporter is inserted into the frame and embedded in the bonding material such that the bonding material encapsulates and is secured to the supporter, wherein a region enclosed between the first substrate and the second substrate is defined with a spare region and a support region outward from a center sequentially, and the frame is located in the support region.

2. The electronic package of claim 1, wherein the bonding material is a thermosetting material.

3. The electronic package of claim 1, wherein the frame is in no contact with the second substrate.

4. The electronic package of claim 1, wherein the frame is made of an insulation material.

5. The electronic package of claim 1, wherein the supporter is not electrically connected to the first substrate.

6. The electronic package of claim 1, further comprising a bonding material separating the supporter from the first substrate.

7. The electronic package of claim 1, further comprising an electronic component disposed on the first substrate.

8. The electronic package of claim 1, further comprising a conductive element disposed on the second surface of the first substrate.

* * * * *